United States Patent
Parthier et al.

(10) Patent No.: US 7,883,578 B2
(45) Date of Patent: Feb. 8, 2011

(54) PROCESS FOR PREPARING $CAF_2$ LENS BLANKS ESPECIALLY FOR 193 NM AND 157 NM LITHOGRAPHY WITH MINIMIZED DEFFECTS

(75) Inventors: Lutz Parthier, Kleinmachnow (DE); Michael Selle, Kleinmoelsen (DE); Erik Foerster, Lengenfeld (DE)

(73) Assignee: Hellma Materials GmbH & Co. KG, Jena (DE)

( * ) Notice: Subject to any disclaimer, the term of this patent is extended or adjusted under 35 U.S.C. 154(b) by 815 days.

(21) Appl. No.: 10/590,059

(22) PCT Filed: Feb. 23, 2005

(86) PCT No.: PCT/EP2005/001890

§ 371 (c)(1),
(2), (4) Date: May 15, 2007

(87) PCT Pub. No.: WO2005/080948

PCT Pub. Date: Sep. 1, 2005

(65) Prior Publication Data

US 2007/0277725 A1    Dec. 6, 2007

(30) Foreign Application Priority Data

Feb. 23, 2004    (EP) .................................. 04004075

(51) Int. Cl.
*G01N 21/896*    (2006.01)
(52) U.S. Cl. .............................. 117/14; 117/38; 117/55; 117/68; 117/201; 117/940
(58) Field of Classification Search ................... 117/14, 117/38, 55, 68, 201, 940
See application file for complete search history.

(56) References Cited

U.S. PATENT DOCUMENTS 6,364,946 B2    4/2002    Staeblein et al.

(Continued)

FOREIGN PATENT DOCUMENTS

DE    100 10 485    9/2001

(Continued)

OTHER PUBLICATIONS

G. Grabosch, K. Knapp, E. Moersen: "Status of the CAF2 Program at Schott Lithotec", 2nd International Sematech 157NM Technical Data Review Meeting, May 2002.

(Continued)

*Primary Examiner*—Matthew J Song
(74) *Attorney, Agent, or Firm*—Michael J. Striker

(57) ABSTRACT

Homogeneity residuals of the refractive index have a strong influence on the performance of lithography tools for both 193 and 157 nm application wavelengths. By systematic investigations of various defects in the real structure of $CaF_2$ crystals, the origin of homogeneity residuals can be shown. Based on a quantitative analysis we define limiting values for the individual defects which can be either tolerated or controlled by optimized process steps, e.g. annealing. These correlations were carried out for all three relevant main crystal lattice orientations of $CaF_2$ blanks. In conclusion we achieved a strong improvement of the critical parameters of both refractive index homogeneity and striae for large size lens blanks up to 270 mm diameter.

3 Claims, 4 Drawing Sheets

U.S. PATENT DOCUMENTS

Figure 1:
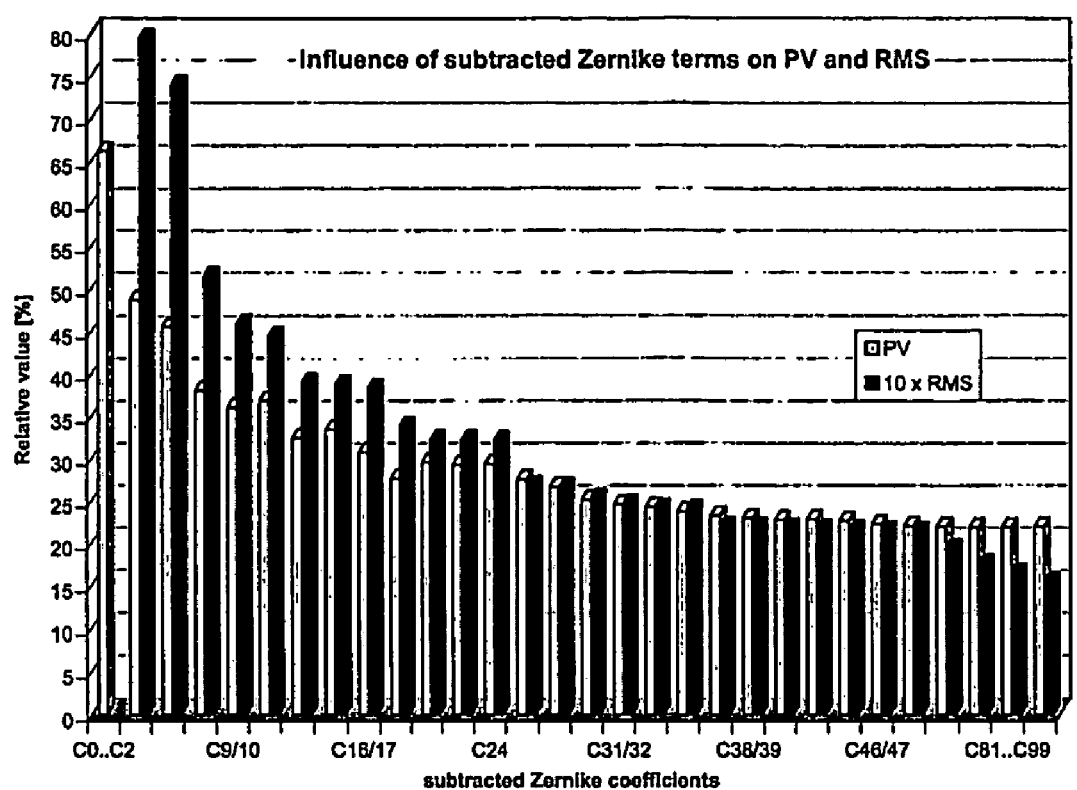

| | | | |
|---|---|---|---|
| 2001/0025598 A1 | 10/2001 | Staeblein et al. | |
| 2001/0043331 A1 | 11/2001 | Rebhan | |
| 2002/0186346 A1* | 12/2002 | Stantz et al. | 351/205 |
| 2003/0089306 A1 | 5/2003 | Speit et al. | |
| 2003/0089307 A1 | 5/2003 | Wehrhan et al. | |
| 2003/0101923 A1 | 6/2003 | Kandler et al. | |
| 2003/0174300 A1* | 9/2003 | Endo et al. | 355/55 |
| 2003/0221610 A1 | 12/2003 | Garibin et al. | |
| 2004/0021803 A1 | 2/2004 | Moersen et al. | |
| 2005/0140967 A1* | 6/2005 | Yamaguchi et al. | 356/124 |
| 2005/0183659 A1 | 8/2005 | Staeblein et al. | |
| 2005/0204998 A1 | 9/2005 | Parthier et al. | |

FOREIGN PATENT DOCUMENTS

| | | |
|---|---|---|
| DE | 10 2004 008 752 | 9/2005 |
| DE | 10 2004 008 753 | 9/2005 |
| DE | 10 2004 008 754 | 9/2005 |
| JP | 11-240798 | 9/1999 |

OTHER PUBLICATIONS

G. Grabosch, K. Knapp, L. Parthier, TH. Westerhoff, E. Moersen: "Calcium Fluoride Quality Improvements Support Availability of First F2 Lithography Tools", 3rd International Sematech 157NM Technical Data Review Meeting, Sep. 2002.

J. Hahn, G. Grabosch, L. Parthier, K. Knapp; Quality Status for 157NM Exposure Tools:, International Sematech & Selete 4th International Symposium on 157NM Lithography, Aug. 2003.

L.A. Shuvalov Ed.: "Modern Crystallography IV" Springer Series in Solid State Sciences 37, pp. 77, 1988.

Engel A et al: "Present and Future Industrial Metrology Needs for Qualification of High-Quality Optical Microlithography Materials" Proceedings of the SPIE, SPIE, Bellingham, VA, US, vol. 4449, 2001, pp. 1-6, XP002280119, ISSN: 0277-786X.

Kuhn B et al: Compaction Versus Expansion Behavior Related to the OH-Content of Synthetic Fused Silica Under Prolonged UV-Laser Irradiation Journal of Non-Crystalline Solids, North-Holland Physics Publishing. Amsterdam, NL, vol. 330, No. 1-3, Nov. 15, 2003, pp. 23-32, XP004471710 ISSN: 0022-3093.

Puryayev D T: Interferometric Method to Measure and Test the Optical Homogeneity of Transparent Materials Optics and Laser Technology, Elsevier Science Publishers BV., Amsterdam, NL, vol. 30, No. 3-4, Apr. 6, 1998, pp. 235-238, XP004141896, ISSN: 0030-3992.

* cited by examiner a. u. 1 a. u. 0.38

PROCESS FOR PREPARING CAF₂ LENS BLANKS ESPECIALLY FOR 193 NM AND 157 NM LITHOGRAPHY WITH MINIMIZED DEFFECTS

The invention relates to a process for preparing $CaF_2$ lens blanks for 193 nm and 157 nm lithography and their use in preparing electronic means.

Homogeneity residuals of the refractive index have a strong influence on the performance of lithography tools for both 193 and 157 nm application wavelengths. By systematic investigations of various defects in the real structure of $CaF_2$ crystals, the origin of homogeneity residuals can be shown. Based on a quantitative analysis we define limiting values for the individual defects which can be either tolerated or controlled by optimized process steps, e.g. annealing. These correlations were carried out for all three relevant main crystal lattice orientations of $CaF_2$ blanks. In conclusion we achieved a strong improvement of the critical parameters of both refractive index homogeneity and striae for large size lens blanks up to 270 mm diameter.

The trend towards ever smaller structures in semiconductor devices is still driven by Moores Law. A major part in the production process for semiconductor devices is optical lithography. The optics used in these lithography tools require materials of exceptional high quality. Due to the application wavelength of 193 nm or in the future 157 nm $CaF_2$ single crystalline lenses are a major part in the optics of this systems. Among other parameters the refractive index homogeneity has a strong influence on the image quality.

G. Grabosch, K. Knapp, E. Moersen: "Status of the $CaF_2$ Program at Schott Lithotec", $2^{nd}$ International Sematech 157 nm Technical Data Review Meeting, May 2002; G. Grabosch, K. Knapp, L. Parthier, Th. Westerhoff, E. Moersen: "Calcium Fluoride Quality Improvements Support Availability of First $F_2$ Lithography Tools", $3^{rd}$ International Sematech 157 nm Technical Data Review Meeting, September 2002; and J. Hahn, G. Grabosch, L. Parthier, K. Knapp: "Quality Status for 157 nm Exposure Tools", International Sematech & Selete $4^{th}$ International Symposium on 157 nm Lithography, August 2003 describe that during the production of $CaF_2$ single crystals several process steps will influence the optical property of the material. In order to further optimize the various defects occurring due to real crystal structure, their influence on optical homogeneity and a method of controlling them during processing were now investigated by the present inventors.

The parameters in homogeneity of the refractive index and stress-induced birefringence (SDB) must also be very low, even for lenses having large diameters. Thereby these parameters should preferably show an residual inhomogeneity (after subtraction of 36 Zernike coefficients or terms) of lower than 0.02 ppm ($2 \times 10^{-8}$) and the SDB-(RMS) should preferably be less than 0.2 nm/cm in the (111) direction, in the (100) direction it should be less than 0.4 nm/cm. This can be obtained by an optimized annealing in a separate temperature furnace which preferably is optimally constructed, as it is described e.g. in DE 10 2004 008 754 A1, DE 10 2004 008 753 A1, DE 10 2004 008 752 A1 and DE 100 10 485 A1.

These quality parameters are now not anymore determined by global, i. e. wide-ranging defects in crystal structures and characteristics but are rather determined by local inhomogeneities. These local inhomogeneities are based on different local defects in the theoretically completely periodical crystal structure. In the present invention the influence of each single defect has been investigated on local effects, e.g. as optical inhomogeneity before and after annealing. The influence of annealing has been investigated for each main orientation (111, 100, 110) on $CaF_2$ blanks. The invention now enables to determine limits for each structural defect and each main orientation before the annealing, thus making it possible to achieve aimed parameters by an adopted, e.g. high temperature, annealing.

The most common crystal defects affecting the refractive index homogeneity in $CaF_2$ are slip planes and small angle grain boundaries and other local real structure defects.

The main method of plastic deformation of crystals is glide. During gliding one part of the crystal is displaced relative to another. Glide occurs over definite crystallographic planes along definite directions. The planes along which the crystal layers move are the slip planes and the direction of the displacement is the slip direction. On a microscopic scale the glide process can be explained with the movement of dislocations through the crystal. A set of all crystallographically equivalent slip planes and directions forms a glide system. For $CaF_2$ the principle glide system is {100}/<110>. Further glide systems are {110}/<110> and at higher temperatures {111}/<110>(see L. A. Shuvalov ed.: "Modern Crystallography IV" Springer Series in Solid State Sciences 37, pp. 77).

Small angle grain boundaries are two dimensional lattice defects comprised of a number of step and/or screw dislocations. They are confined to small volumes. Depending on the misorientation angle, the inclination of the grain boundary and the translational displacement between neighboring sub grains, two types of sub grain boundaries can be distinguished: tilt and twist boundaries. One refers to small angle grain boundaries in case the difference in orientation is small, i.e. in the range of minutes up to a few degrees. Small angle grain boundaries can be formed e. g. during crystal growth caused by thermal fluctuations at the solid liquid interface and or impurities at the interface. Normally small angle grain boundaries are accompanied by a short range stress field.

In some cases small angle grain boundaries rearrange and form more extended structures. These structures are not aligned to a specific crystallographic direction and occur as a local distortion in the homogeneity interferograms. These distortions have also a detrimental effect on the optical image quality.

Each optical medium shows dispersion, i.e. its diffraction is dependent upon the wave length. Accordingly, any real picture imaged by a lens system is a summary of overlayed monochromatic images. Only narrow light sources like a laser are able to limit these types of aberration. Besides this, any impairment of the geometrical form of an optical lens creates aberration leading to a decrease in resolution.

It is well known to describe waves and wave fronts of an optical system mathematically by series expansion. For optical application the Zernike polynome is often used, which describes a wave front as a summary of terms.

$$W(x, y) = \sum_{i=1}^{n} C_i Z_i(x, y)$$

In this polynome each Zernike coefficient can be assigned to a discrete type of aberration. For example, coefficient $C_1$ describes the tilt in the x-axes, $C_2$ the tilt in y-axes, $C_3$ the astigmatism in ±45°, $C_4$ describes the defocus, $C_5$ the astigmatism in 0° and 90° and so on.

The wave fronts of such optical systems can be detected by several ways, e.g. by means of a CCD camera.

FIG. 1 shows the influence of Zernike terms subtracted on PV (Peak to Valley, which is the maximal difference between the highest and lowest value measured within a blank.) and RMS value (root mean square).

In applicants ongoing effort for quality improvement the influence of the annealing process on the homogeneity in (100), (110) and (111) oriented CaF$_2$ lens blanks has been investigated. Therefore homogeneity wave fronts were taken under the same conditions before and after annealing. The interferometer used is a ZEISS D100 Fizeau type interferometer, the spatial resolution was 0.2 µm. Before analyzing the wave fronts for crystal defects the first 36 Zernike terms were subtracted. In this residual wave front crystal defects can be detected and analyzed more easily. A subtraction of further Zernike terms did not improve the results due to an asymptotic effect on PV and RMS as shown in FIG. 1.

Figure 2:
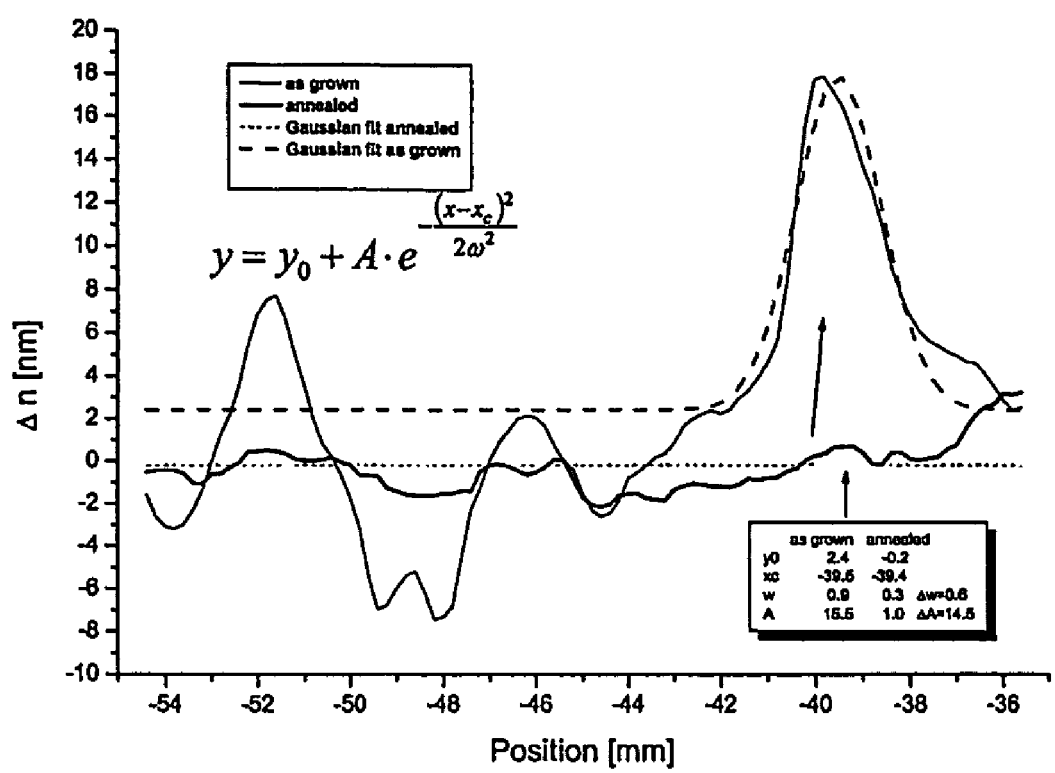

FIG. 2 shows an example of performed fitting of a defect structure cross section before annealing (thin line), and after annealing (bold line).

The analysis has been performed as follows:

Before and after annealing the strongest defect structures in the wave front was analyzed. Then for the individual defect structures a Gaussian fit of the cross sections was performed. It is also possible to use other types of best fit functions known in the art, as for example a Lorentz fit. The fit provides values for amplitude (height), corresponding to delta n (refractive index) and half width (in mm). The observed change in amplitude and half width due to annealing of corresponding defect structures are calculated relative to the starting value.

Figure 3A:
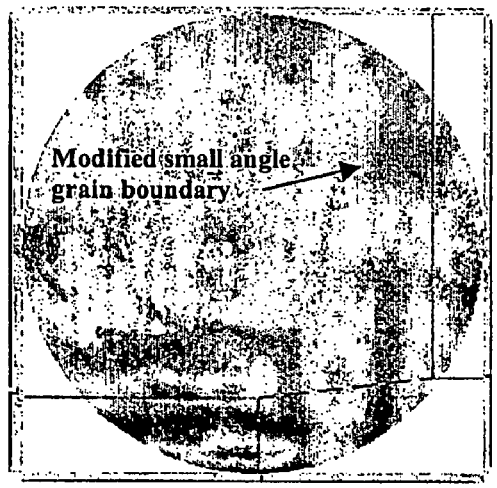
Figure 3B:
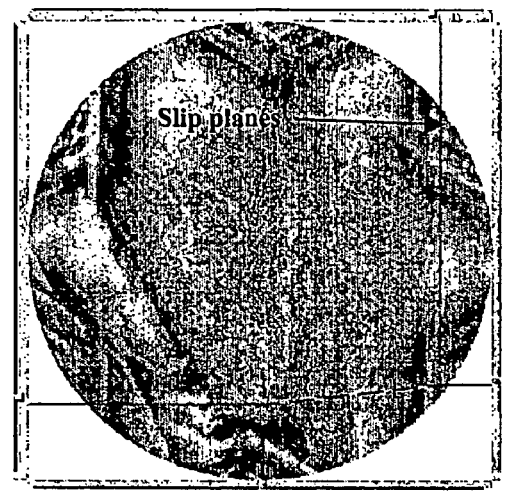

FIG. 3 shows a cross section scan in homogeneity wave front before (FIG. 3a) and after annealing (FIG. 3b) of a crystal.

For a better illustration of the applied procedure in the following the analysis considering as example a blank with untypical high defect level (FIG. 3a, b) will be discussed. Homogeneity wave fronts after subtraction of the first 36 Zernike terms before and after annealing is compared. After annealing an improvement of the total residual structure can clearly be seen. Whereas before annealing the homogeneity is dominated or disturbed by long range structures, after annealing homogeneity is more affected by the short range defect structures. The relative improvement of RMS-Residual is about 30%. While the maximum amplitude of a single local structure defect could be reduced to 60% of the starting value the corresponding maximum half width could be minimized down to 30%.

Each defect structure observed is categorized for type and blank orientation For the values found typical for the defect behavior the mean value was calculated. The results obtained are discussed below.

The annealing process has only a very small influence on small angle grain boundaries in {111} oriented lens blanks. The reduction of the amplitude was in the range of about 20%, the width was nearly constant. For other orientations a similar behavior can be achieved.

In a modified form small angle grain boundaries generate more extended defect structures. In spite of the "normal" small angle grain boundary we find a clear orientation dependence for the annealing performance. While we obtained a 20% reduction for the amplitude and about 30% for the half width for {100} and {110} orientation, whereas the values for {111} a mostly unchanged.

During the annealing process slip planes become activated and relax along glide systems. For CaF$_2$ this is in general the $\{100\}/\leq 110>$ glide system. In case small angle grain boundaries are present they can hamper the relaxation of the slip planes.

The annealing results show a strong improvement for all blank orientations. Especially for the {111} orientation the slip planes can completely disappear. That means slip planes are not dominating the residual of the refractive index homogeneity. For the other orientations the amplitude can be reduced by a factor up to 5.

From the results discussed above applicants have found that it is now for the first time possible to define critical maximum values for the different real structure phenomena before annealing for each orientation. Under these conditions the annealed lens blanks reach the required quality for the residual homogeneity.

The invention has therefore for its aim to provide a method for preparing optical elements especially optical elements made of crystalline material wherein it is possible to classify defects in a crystal structure e.g. as slip planes, small angle grain boundaries, linear structures and others, as well as mixed structural defects. According to the invention, an image of a homogeneity (e.g. as shown in FIG. 3) is established (preferably with a CCD-Camera) a single structure (defect) is analyzed by measuring homogeneity in said image and determining the RMS-value (36 Zernike co-efficients subtracted) for said structure or defect. Thereby, a line scan is obtained from the structure and the local defect is identified as a peak. This peak is defined by a Gaussian fit with the parameters height of the peak (amplitude) and half-width. Both are found to be absolute values for the blank as shown in FIG. 2. By integrating the length of said defect in said homogeneity image, the amount of the defect can be calculated from the overall value of the blank. Thereby, the influence of each single defect on the overall value becomes determinable. The above analysis is done before and after the annealing of the blank. On the basis of this analysis, an evaluation of the influence of each defect structure and defect type in each single blank on each critical parameter becomes possible. It was found that a blank having a residual homogeneity (rms) below $2.0 \times 10^{-8}$ can be obtained if a single local defect, when analyzed by a Gaussian fit of its cross section, as described herein, does not exceed a peak amplitude of maximal $dn=5.0 \times 10^{-8}$ and a half-width below 2 mm in its lateral dimension.

According to the invention, it is now possible to effectively determine these blanks for which a annealing is possible and limiting values can be defined.

In the following we present achieved improvements for the most difficult {100} oriented lens blanks.

Through a better approach for describing the blank quality as described above it is now possible to improve the material quality of our CaF$_2$ lens blank material. The following Table 1 shows the average and standard deviation values achieved for (100) oriented lens blanks for two main quality parameters. The introduction of the advanced conditions lead to a 31% decrease of the stress birefringence RMS value. For the refractive index homogeneity a similar large quality enhancement of about 26% could be realized. Especially the reduction of the short range refractive index homogeneity is of considerably importance since this parameter causes flare in the imaging.

The reproducibility as represented by the standard deviation in line 2 is essential for the production process. For both parameters we achieve a significant progress. For stress birefringence the new conditions lead to reduction of the scattering of the values by a factor of 2. The advancement for homogeneity is even larger. The reduction is of a factor of approx 5. The quality level of these (100) oriented lens blanks meets the currently known requirements for the application in projection optics for both 193 nm and 157 nm wavelength.

The following Table 1 shows the achieved quality improvement for stress birefringence and short range refractive index homogeneity for (100) oriented CaF$_2$-crystals:

TABLE 1

| New conditions | | Old conditions | |
|---|---|---|---|
| SBR(rms) average [nm/cm] | Short range refractive index homogeneity, average | SBR(rms) average [nm/cm] | Short range refractive index homogeneity average set = 1 |
| 0.37 ±0.08 | 0.74 ±0.09 | 0.54 ±0.16 | 1 ±0.44 |

Figure 4A:
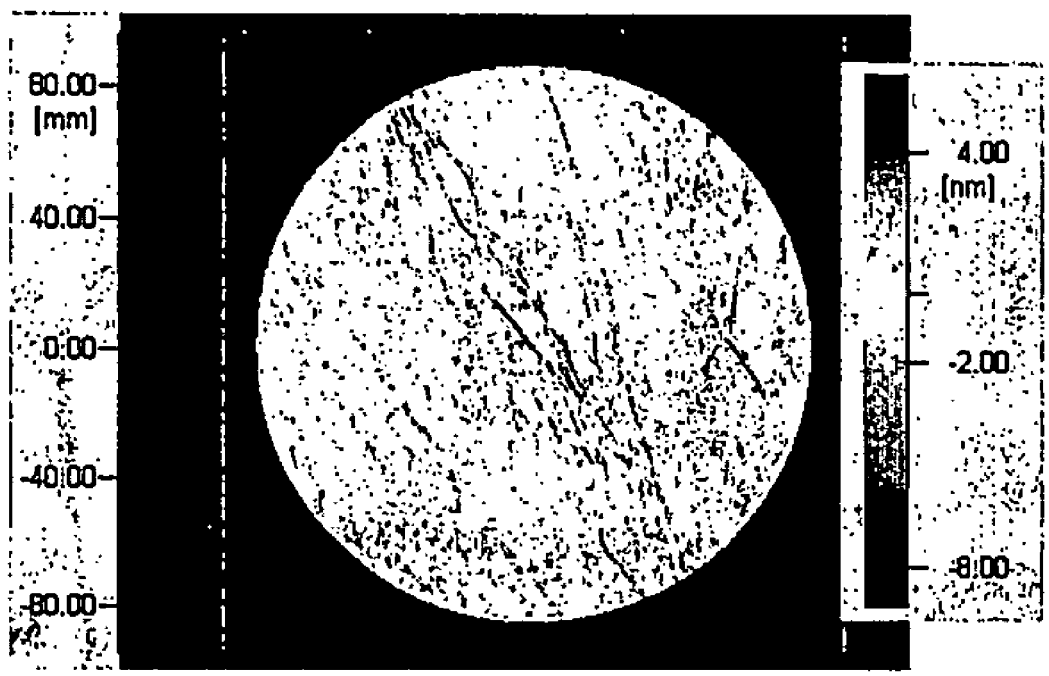
Figure 4B:
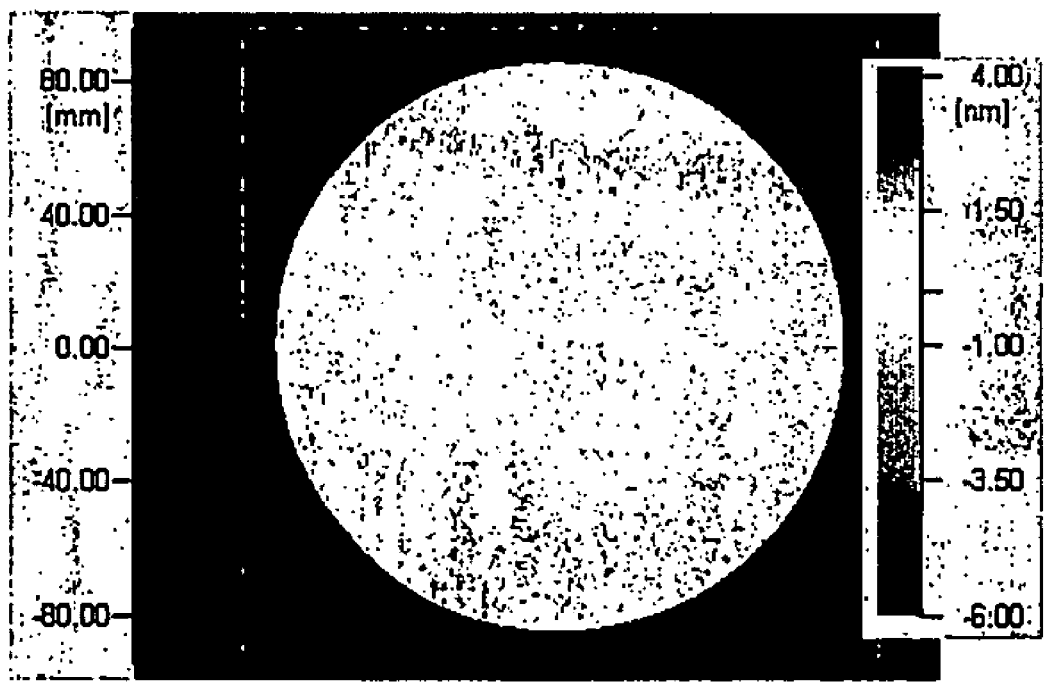

FIG. 4 shows the short range refractive index homogeneity for (100) oriented $CaF_2$ lens blank before (FIG. 4a) and after improvement (FIG. 4b).

FIGS. 4a and 4b illustrate the reduction of local defect structures as reflected by the short range refractive index homogeneity for champion lens blanks. FIG. 4a clearly shows the residual of defect structures after annealing. The remaining structures are mainly slip planes but also small angle grain boundaries in different modifications are visible. Through the measures applied the remaining crystal defects could be reduced to a very low level. FIG. 4b shows that the primary slip plane system $\{100\}/\leqq110>$ has disappeared and only a few traces indicate the secondary system running along $\{111\}/\leqq110>$. No other defect structures can be observed. With the present invention lens blanks especially in the 100 blanks having a homogeneity of $2\times10^{-8}$ can selectively be obtained. Accordingly, optical elements and lens systems, especially for lithography can be achieved with the present invention having superior imaging behavior and a homogeneity in its 100 crystal elements of at least $2\times10^{-8}$ or better. The same can be obtained with 111 blanks.

The invention has therefore also for its aim to prepare lenses, prisms, light conducting rods or optical windows for DUV photolithography, steppers, excimer lasers, computer chips and integrated circuits as well as electronic equipment containing said computer chips and said integrated circuits by means of optical elements obtained by the present classification or selection method.

The influence of various crystal defects on the optical material quality of $CaF_2$ is determined. With the process of the invention including further improvement of the annealing process applied to critical (100) oriented $CaF_2$ lens blanks the amount of defect structures can be reduced significantly.

The invention claimed is:

1. Process for preparing crystalline optical elements, wherein structural defects in a crystal blank are classi-fied, characterized in that a homogeneity image of said blank is established showing at least one single structural defect, having a length and width analyzing said single structural defect by measuring homogeneity and determining an RMS-value of said single structural defect in which the first 36 Zernike coefficients are subtracted, thereby ob-taining a line scan of said defect and identifying said de-fect as a peak, defining said peak by its amplitude and halfwidth by means of a fit curve and integrating said peak over the length of said single structural defect of said homogeneity image.

2. Process according to claim 1, characterized in that the ratio of said integrated value of said defect and the over-all RMS value of the blank is determined, thereby determi-ning the influence of said single defect on the overall ho-mogeneity of said blank.

3. Process according to claim 1 or 2, characterized in that the crystal blank is a $CaF_2$ crystal.

* * * * *